United States Patent
Mao (10) Patent No.: US 12,044,720 B1
(45) Date of Patent: Jul. 23, 2024

(54) MULTI-CORE TEST PROCESSOR, AND INTEGRATED CIRCUIT TEST SYSTEM AND METHOD

(71) Applicant: Macrotest Semiconductor Inc., Nanjing (CN)

(72) Inventor: Guoliang Mao, Nanjing (CN)

(73) Assignee: Macrotest Semiconductor Inc.

( * ) Notice: Subject to any disclaimer, the term of this patent is extended or adjusted under 35 U.S.C. 154(b) by 0 days.

(21) Appl. No.: 17/801,529

(22) PCT Filed: Apr. 18, 2022

(86) PCT No.: PCT/CN2022/087319
§ 371 (c)(1),
(2) Date: Aug. 23, 2022

(87) PCT Pub. No.: WO2023/035615
PCT Pub. Date: Mar. 16, 2023

(30) Foreign Application Priority Data

Sep. 7, 2021 (CN) .......................... 202111040904.3

(51) Int. Cl.
*G01R 31/26* (2020.01)
*G01R 31/28* (2006.01)

(52) U.S. Cl.
CPC .................. *G01R 31/2834* (2013.01)

(58) Field of Classification Search
CPC ................ G01R 31/28; G01R 31/2834; G01R 31/2815; G01R 31/318342; G01R 31/318555; G01R 31/318572; G01R 31/3177; G01R 31/3172
See application file for complete search history.

(56) References Cited

U.S. PATENT DOCUMENTS

| | | | | |
|---|---|---|---|---|
| 2001/0037480 | A1* | 11/2001 | Whetsel | G01R 31/2851 714/727 |
| 2003/0126515 | A1* | 7/2003 | Abdo | G06F 11/2242 714/37 |
| 2007/0083351 | A1 | 4/2007 | Van Assche et al. | |
| 2007/0109888 | A1 | 5/2007 | Baker | |
| 2009/0193303 | A1* | 7/2009 | Giles | G06F 11/2236 714/E11.155 |
| 2012/0261662 | A1 | 10/2012 | Liang et al. | |
| 2019/0278677 | A1* | 9/2019 | Terechko | G06F 11/27 |

* cited by examiner

*Primary Examiner* — Thang X Le
(74) *Attorney, Agent, or Firm* — Jose Cherson Weissbrot (57) ABSTRACT

The present disclosure discloses a multi-core test processor, and an integrated circuit test system and method. The multi-core test processor includes a co-test-processor-sync-controller, a master-test-processor, two or more co-test-processors, and a test subsystem command switching device. Several co-test-processors are introduced under the master-test-processor. The master-test-processor will deliver test patterns that require concurrent testing to the co-test-processors for execution, so as to complete test items similar to the asynchronous signal match test. After the co-test-processors complete the test, the master-test-processor continues to carry out the subsequent test. The present disclosure can achieve asynchronous concurrent test on multiple sites and improve the test efficiency. Meanwhile, idling of fewer test channels can be avoided when asynchronous test channels are allocated to each site, thereby improving test channel utilization rate.

9 Claims, 6 Drawing Sheets

MULTI-CORE TEST PROCESSOR, AND INTEGRATED CIRCUIT TEST SYSTEM AND METHOD

TECHNICAL FIELD

The present disclosure relates to integrated circuit Auto Test Equipment (ATE), and belongs to the field of semiconductor manufacturing, instruments and apparatuses, digital signals, mixed signal chip testing, and memory chip testing.

BACKGROUND

A match test on an output signal is often required in a testing process of a digital integrated circuit, for example, waiting for a rising edge or a falling edge of an IO output of a Device Under Test (DUT), or waiting for completion of burning of data written in a memory device. Due to the fact that parallel testing of multiple sites will be required in actual mass production, and to-be-matched states of all the DUTs appear at different time points, so that items of all the sites requiring the match test cannot be completely tested through an efficient concurrent test method.

Test processors in existing test equipment are all designed on the basis of a single-core test processor, and each test processor controls a certain number of test channels. By means of synchronous or asynchronous work of one or more single-core test processors, the parallel or concurrent testing of a single or multiple chips is completed. There are mainly three traditional test methods derived from the test equipment designed on the basis of this architecture:

Traditional test method I: the entire test system shares one test processor. The match test is performed on an output signal of each site by a serial test method. This method is simple and flexible, but the test efficiency is the lowest. The total test time is the sum of the test time of all the sites. As the number of parallel sites increases, the overall test efficiency is extremely low.

Traditional test method II: output match signals of all the sites are matched at the same time. When the match signals of all the sites pass (pass or fail), it is considered that the match test succeeds. This method is more efficient than the first method. However, the test flexibility of each site is sacrificed. For example, it is impossible to accurately know the occurrence time of the match signal of each site. The match signals of some sites appear first, and the subsequent test cannot be continued until those sites appearing later satisfy the conditions, so that the test may possibly fail.

Traditional test method III: one independent test processor is assigned to each site. Each site runs in an independent clock domain, and each site completes its own match test independently. Compared with the first two methods, this method has the advantages of flexible testing, timely matching, accurate test parameters, high efficiency, and the like. However, this method has the disadvantages of high test cost, low test channel utilization rate, and the like. At present, this method is mainly used in high-end mixed signal ATE. This method is widely accepted because the high profit of a high-end DUT can handle with the high test cost of a high-end platform. However, a large number of low- and medium-end DUTs cannot afford extremely high test cost. Therefore, low- and medium-end test platforms often do not have this function. A method that can solve the problems of high test cost and low test channel utilization rate will be a better test method.

SUMMARY

The purpose of the invention: considering that in a testing process of most integrated circuits, items requiring a match test have a low proportion among total test items, this type of items often need a relatively small test vector. The present disclosure provides a multi-core test processor, and an integrated circuit test system and method. Compared with the current three test methods, the present disclosure can inherit the advantages of high efficiency, flexibility and test accuracy of multiple processors in method III, and also avoids the disadvantages of high test cost of method III. The test channel utilization rate is high, and the test cost is close to those in method I and method II.

Technical Solution

In view of the problems of high test cost and low test channel utilization rate in traditional test method III, main causes are as follows: on the one hand, each DUT adopts an independent test processor. There are a few of resources of the test processor for ATE, and the cost is relatively high. On the other hand, each independent test processor is shared by a certain number of test channels. The number of pins of a single DUT is often smaller than the number of test channels corresponding to one test process, so that in order to achieve independent match test on a plurality of DUTs, each test processor can only correspond to one DUT. As a result, some redundant test channels cannot be used, so that the test cost for the single DUT is increased.

In order to solve this problem, it is necessary to achieve a design architecture of a multi-core test processor. First, in order to achieve that the test cost is close to or slightly higher than that of a single-core test processor architecture, the multi-core test processor need to maintain the design of one Master-Test-Processor (MTP). In order to achieve asynchronous signal match test of a plurality of DUTs and maximize the test channel utilization rate, it is necessary to introduce several Co-Test-Processors (CTPs) under the MTP. The MTP will deliver test patterns that require concurrent testing to the CTPs for execution, so as to complete test items similar to the asynchronous signal match test. After the CTPs complete the test, the MTP continues to carry out the subsequent test. All test channels can be switched and controlled between the two kinds of test processors. Since the number of channels controlled by each CTP is much smaller than the number of channels controlled by one MTP, idling of fewer test channels can be avoided when asynchronous test channels are allocated to each DUT, thereby improving test channel utilization rate.

A multi-core test processor includes a co-test-processor-sync-controller, a master-test-processor, two or more co-test-processors, and a test subsystem command switching device; the master-test-processor is connected to the co-test-processors through a command bus I; the master-test-processor is connected to the test subsystem command switching device through a command bus II; the co-test-processors are connected to the test subsystem command switching device through a command bus II.

The master-test-processor is a global test processor; the master-test-processor works synchronously or asynchronously with other global processors, executes master test pattern files in parallel or concurrently, then sends a master test command to each subordinate test subsystem, and at the same time, delivers local test patterns that require concurrent testing to the co-test-processors for execution.

The co-test-processor-sync-controller is configured to control whether all the co-test-processors work synchronously or asynchronously.

The co-test-processors are local test processors, and the co-test-processors are controlled by the master-test-processor to execute the local test pattern files, and then send a local test command to the subordinate test subsystems of the co-test-processors.

The test subsystem command switching device is configured to switch the master test commands sent by the master-test-processor to the subordinate test subsystems of the master-test-processor, and switch the local test commands sent by the co-test-processors to the subordinate test subsystems of the co-test-processors.

Preferably, the master-test-processor and the co-test-processors are built according to a Von Neumann architecture test processor, the on Neumann architecture test processor includes a timing generator, a test pattern generator, a signal processing unit control command generator, a memory control, and a pattern memory.

The pattern memory is configured to store a compiled test pattern file code.

The timing generator, the test pattern generator, and the signal processing unit control command generator access the pattern memory through the memory control to acquire commands and data.

The timing generator is configured to generate an accurate timing signal required by each cycle according to a timing requirement specified by the pattern file in the compiled test pattern file code.

The test pattern generator is configured to generate, according to the command requirement of the pattern file in the compiled test pattern file code and the accurate timing signal generated by the timing generator, a control timing required by the pattern test, and control the memory control to access an address of the pattern memory.

The signal processing unit control command generator is controlled by the control timing generated by the test pattern generator to send the test subsystem control command to the corresponding subsystems to achieve synchronous control of the subsystems.

Preferably, each co-test-processor and the master-test-processor asynchronously work in different clock domains, and the co-test-processor and other co-test-processors work in the same or different clock domains.

Preferably, all the co-test-processors are controlled by the co-test-processor-sync-controller to work in the same or different clock domains independently or group by group.

A digital signal test board device includes a bus controller, a multi-core test processor, a test subsystem controller, a test subsystem control bus, and a digital test subsystem.

The bus controller is configured to achieve communication control between the digital signal test board device and a PC terminal;

The multi-core test processor is configured to execute a test pattern file and generate a control command for the test subsystem.

The test subsystem control bus is configured to transfer a control command between the multi-core test processor and the test subsystem.

The test subsystem controller is configured to receive the control command generated by the multi-core test processor for the test subsystem, and generate a test subsystem channel control command according to the control command.

The test subsystem receives the test subsystem channel control command generated by the test subsystem controller, and outputs any digital test timing signal according to a requirement of the test pattern file, or performs match analysis on any signal under test.

Preferably, the test subsystem is composed of a digital level driver, a window comparator, a dynamic load generator and a precision current source.

An automatic test system includes a master control PC, and one or more digital signal test board devices.

The master control PC is configured to run a test program to generate a board working signal, and transmit the board working signal to the corresponding digital signal test board devices to control the digital signal test board devices to work.

Each digital signal test board device is configured to execute a test pattern file according to the board working signal, generate a test excitation signal to a DUT, analyze a response of the DUT to form a test result, and transmit the test result to the master control PC.

Preferably, the automatic test system includes a Peripheral Component Interface Express (PCIE) bus controller, and the PCIE bus controller is configured to achieve data communication between the master control PC and the digital signal test board devices.

Preferably, the automatic test system includes a high-speed backplane bus, and the high-speed backplane bus is configured to achieve data transmission between the PCIE bus controller and the digital signal test board devices, and signal synchronization between all the digital signal test board devices.

An automatic test method includes the following steps:
step 1, downloading, by the master control PC, pattern files corresponding to test processors in all the digital signal test board devices into the pattern memories of the corresponding test processors through the PCIE bus controller;
step 2, configuring, by the master control PC, all the used digital signal test board devices to be in desired states according to a requirement of a DUT;
step 3, synchronously initiating, by the master control PC, all the master-test-processors of all the digital signal test board devices, executing master test pattern files for concurrent testing, and analyzing a response of the DUT to form a test result I;
step 4, executing, by all the master-test-processors, local test pattern files that require asynchronous match or concurrent testing, and initiating the corresponding co-test-processors;
step 5, executing, by all the co-test-processors, concurrent testing on the local test pattern files to perform concurrent signal match on a plurality of DUTs, analyzing responses of the DUTs to form test results II, and transmitting the test results II to the master control PC;
step 6, determining whether the corresponding co-test-processors complete the execution in a waiting period of all the master-test-processors; if the execution ends, transmitting the test result I to the master control PC;
step 7, acquiring, by the master control PC, the test result I and the test results II; comprehensively analyzing whether the test on the DUTs succeeds; if the test succeeds, informing sorting equipment to process the DUTs as qualified products; and if the test fails, informing the sorting equipment to process the DUTs as disqualified products.

Compared with the prior art, the present disclosure has the following beneficial effects:
1. Concurrent testing of asynchronous concurrent signal match test items that can be only completed by multiple cores can be completed in the case that the cost is close to the cost of a single-core test processor test method. 2. The test duration of asynchronous concurrent match test items of multiple sites can be shortened, so that the cost of single test is reduced. 3. A concurrent multi-clock-domain test signal that cannot be generated by a single-core test processor can be generated, thus completing items that require concurrent testing.

DETAILED DESCRIPTION OF THE EMBODIMENTS

The present disclosure will be further clarified below in combination with the accompanying drawings and specific embodiments. It should be understood that these examples are only used to illustrate the present disclosure and not to limit the scope of the present disclosure. Modifications made by those skilled in the art in various forms of valence all fall within the scope defined by the appended claims of the present application.

Figure 2:
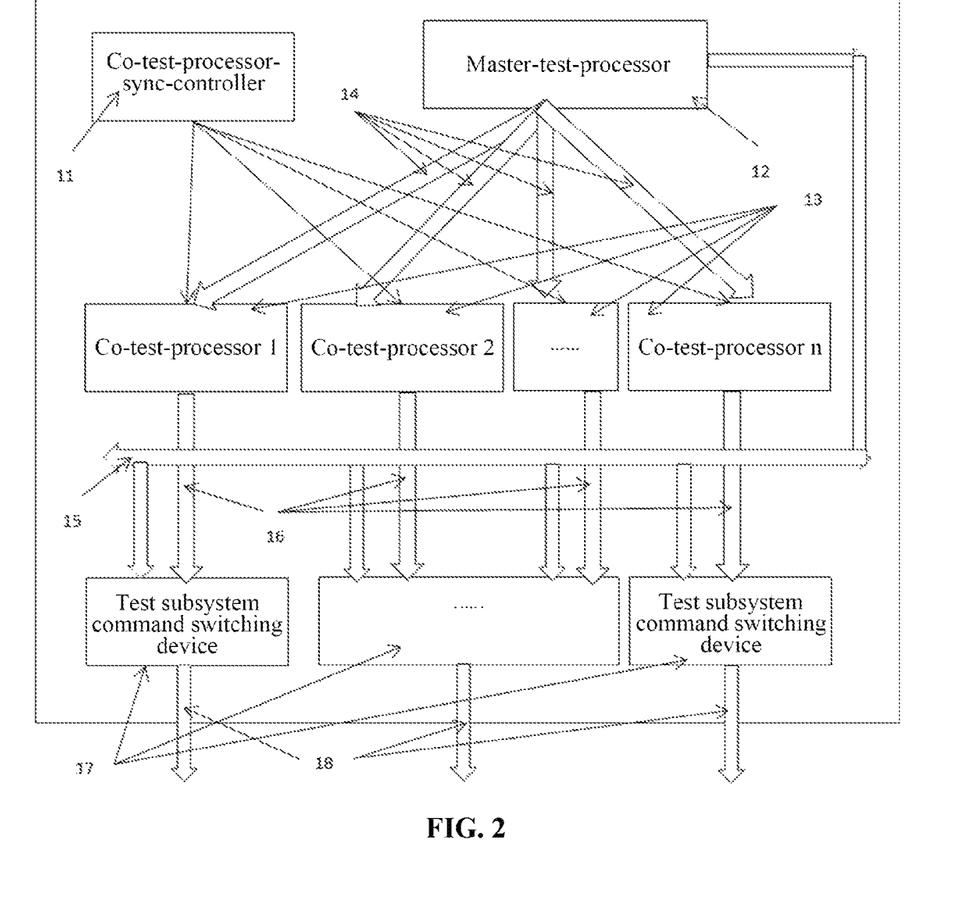
FIG. 2 is a block diagram of a multi-core test processor.

A multi-core test processor, as shown in FIG. 2, includes a co-test-processor-sync-controller 11, a master-test-processor 12, several co-test-processors 13, and a test subsystem command switching device 17; the master-test-processor 12 is connected to the co-test-processors 13 through a command bus I 14; the master-test-processor 12 is connected to the test subsystem command switching device 17 through a command bus II 15; the co-test-processors 13 are connected to the test subsystem command switching device 17 through a command bus III 16.

The master-test-processor (MTP) is a global test processor; the master-test-processor 12 can work synchronously or asynchronously with other global processors; execute master test pattern files in parallel or concurrently, including sequential execution, jump and circulation of a pattern file vector, then send a master test command to each subordinate test subsystem, and at the same time, deliver local test patterns that require concurrent testing to the co-test-processors 13 for execution, and control all the co-test-processors.

The co-test-processor-sync-controller (CTPSC) is configured to control whether all the co-test-processors 13 work synchronously or asynchronously.

The co-test-processors (CTPs) are local test processors. The co-test-processors 13 are controlled by the master-test-processor 12 to execute the local test pattern files, including sequential execution, jump and circulation of a pattern vector, and then send a local test command to the subordinate test subsystems of the co-test-processors. The local test pattern files include items that require concurrent match test. Each CTP and the master-test-processor asynchronously work in different clock domains, and the CTP and other CTPs work in the same or different clock domains. It is noted that each MTP can control the several CTP. All the CTPs can be controlled by the CTPSC to work independently or group by group in the same or different clock domains (that is, synchronously or asynchronously). All the CTPs can execute the same test pattern program or execute different test pattern programs, thus achieving a parallel or concurrent testing process. Different from the MTP, the CTPs support a fewer of test command sets.

The test subsystem command switching device 17 is configured to switch the master test commands sent by the master-test-processor 12 to the subordinate test subsystems of the master-test-processor, and switch the local test commands sent by the co-test-processors 13 to the subordinate test subsystems of the co-test-processors.

A master test command and a local test command are collectively referred to as a control command 18.

The command bus I 14 is a command bus between the MTP and the CTP. The MTP sends commands, such as Start: start the CTP, Stop: stop the CTP and Load: load the CTP, to the CTP through the command bus I 14.

The command bus II 15 is a command bus between the MTP and the test subsystem. The MTP controls all the test subsystems to execute specified operations through the command bus, including Drive, Compare and the like.

The command bus III 16 is a command bus between the CTP and the test subsystem. The CTP controls all the test subsystems to execute specified operations through the command bus, including Drive, Compare and the like.

Figure 1:
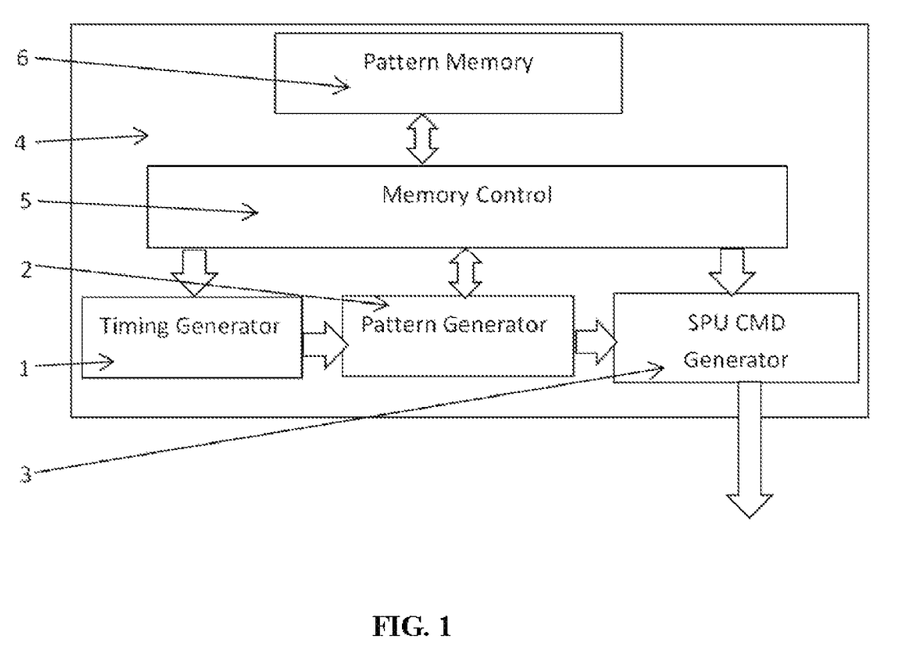
FIG. 1 is a schematic diagram of an internal structure of a test processor.

The master-test-processor and the co-test-processors are built according to a Von Neumann architecture test processor 4; as shown in FIG. 1, the on Neumann architecture test processor 4 includes a timing generator 1, a test pattern generator 2, a signal processing unit control command generator 3, a memory control 5, and a pattern memory 6.

The pattern memory 6 is configured to store a compiled test pattern file code.

The timing generator (TG) (1) is configured to generate an accurate timing signal required by each cycle according to a timing requirement specified by the pattern file in the compiled test pattern file code.

The test pattern generator 2 is configured to generate, according to the command requirement of the pattern file in the compiled test pattern file code and the accurate timing signal generated by the timing generator 1, a control timing (including jump, circulation and the like) required by the pattern test, and control the memory control 5 to access an address of the pattern memory;

The signal processing unit control command generator 3 is controlled by the control timing generated by the test pattern generator 2 to send the test subsystem control command to the corresponding subsystems to achieve synchronous control of the subsystems. That is, the signal processing unit control command generator 3 is configured to generate, according to a pattern file control requirement, a command signal for synchronously controlling digital channel test subsystems.

The test processor (TP) 4 is a typical Von Neumann architecture test processor, but a command set adopts a command set special for ATE and is specially used for processing signals, instead of data. The pattern memory stores the compiled test pattern file code. The timing generator 1, the test pattern generator 2 and the signal processing unit control command generator 3 access the pattern memory through the memory control 5 to acquire commands and data. The timing generator 1 is in charge of generating information, such as cycle and time edge, corresponding to the current cycle and providing the information to other modules. The test pattern generator 2 is in charge of executing a command requirement in a test pattern to achieve jump and circulation, and controlling the memory control to access an address of the pattern memory. The memory control is controlled by the test pattern generator 2 to send the control command of the test subsystem to corresponding subsystems to achieve synchronous control of the subsystems.

Figure 3:
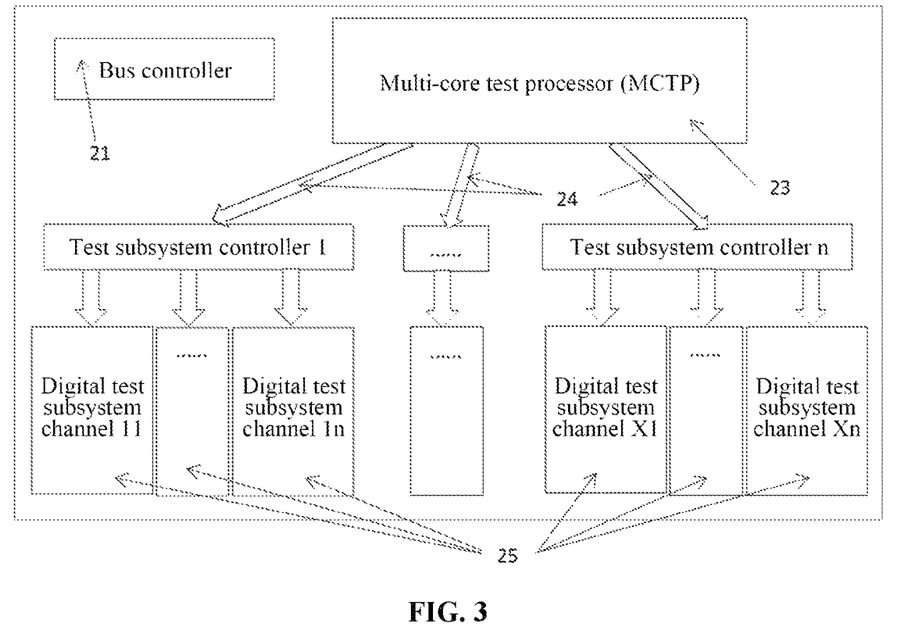
FIG. 3 is a block diagram of a digital signal test board device.

A digital signal test board device, as shown in FIG. 3, includes a bus controller 21, a multi-core test processor 23, a test subsystem controller, a test subsystem control bus 24, and a digital test subsystem.

The bus controller 21 is configured to achieve communication control between the digital signal test board device and a PC terminal.

The Multi-Core Test Processor (MCTP) 23 is configured to execute a test pattern file and generate a control command for the test subsystem.

The test subsystem control bus 24 is configured to transfer a control command between the multi-core test processor 23 and the test subsystem. It is noted that each test subsystem controller corresponds to one co-test-processor. Each subsystem controller controls a group of digital test subsystems.

The test subsystem controller is configured to receive the control command generated by the multi-core test processor 23 for the test subsystem, and generate a test subsystem channel control command according to the control command.

The test subsystem 25 is composed of a digital level driver, a window comparator, a dynamic load generator, a precision current source and the like. Each digital test subsystem receives the test subsystem channel control command generated by the test subsystem controller, and outputs any digital test timing signal according to a requirement of the test pattern file, or performs match analysis on any signal under test.

The whole test system is connected to the above-mentioned board device through a high-speed bus backplane, so that a large-size digital test system can be formed, which is a complicated system for completing test of any digital signal in the parallel or concurrent test of multiple DUTs.

Figure 4:
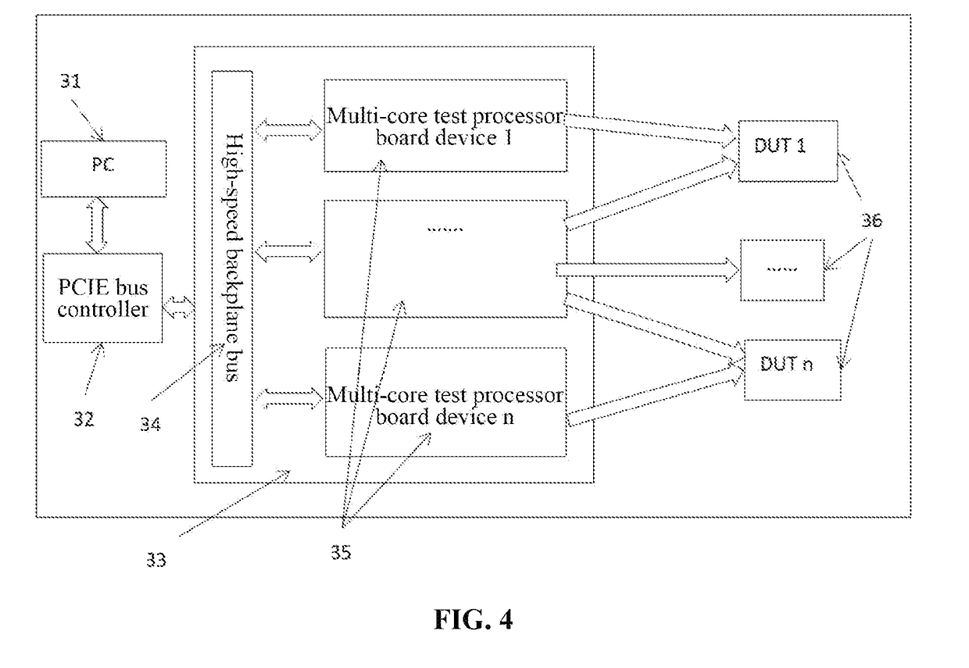
FIG. 4 is a block diagram of an automatic test system.

An automatic test system, as shown in FIG. 4, includes a master control PC 31, a PCIE bus controller 32, a high-speed backplane bus 34 and one or more digital signal test board devices 35.

The master control PC 31 is configured to run a test program to generate a board working signal, and transmit the board working signal to the corresponding digital signal test board devices 35 through the PCIE bus controller 32 and the high-speed backplane bus 34 to control the digital signal test board devices 35 to work. The master control PC is configured to analyze test results, data processing and the like.

Preferably, the PCIE bus controller 32 is configured to achieve data communication between the master control PC 31 and the digital signal test board devices 35.

The high-speed backplane bus 34 is configured to achieve data transmission between the PCIE bus controller 32 and the digital signal test board devices 35, and signal synchronization between all the digital signal test board devices 35.

Each digital signal test board device 35 is configured to execute a test pattern file according to the board working signal, generate a test excitation signal to a DUT, analyze a response of the DUT to form a test result, and transmit the test result to the master control PC 31 through the PCIE bus controller 32 and the high-speed backplane bus 34. The master control PC 31 determines device Pass/Fail.

For the Device Under Test (DUT) 36, it is noted that each DUT represents one site. Each DUT possibly occupies a test channel resource of one or more board devices.

An automatic test method includes the following steps:

Step 1, the master control PC 31 downloads pattern files corresponding to test processors in all the digital signal test board devices 35 into the pattern memories 6 of the corresponding test processors through the PCIE bus controller 32.

Step 2, the master control PC 31 configures all the used digital signal test board devices 35 to be in desired states according to a requirement of a DUT.

Step 3, the master control PC 31 synchronously initiates all the master-test-processors of all the digital signal test board devices 35, executes master test pattern files for concurrent testing, and analyzes a response of the DUT to form a test result I.

Step 4, all the master-test-processors executes local test pattern files that require asynchronous match or concurrent testing, and initiates the corresponding co-test-processors 13.

Step 5, all the co-test-processors 13 executes concurrent testing on the local test pattern files to perform concurrent signal match on a plurality of DUTs, analyzes responses of the DUTs to form test results II, and transmits the test results II to the master control PC 31.

Step 6, whether the corresponding co-test-processors 13 complete the execution in a waiting period of all the master-test-processors is determined; if the execution ends, the test result I is transmitted to the master control PC 31.

Step 7, the master control PC 31 acquires the test result I and the test results II; comprehensively analyzes whether the test on the DUTs succeeds; if the test succeeds, informs sorting equipment to process the DUTs as qualified products; and if the test fails, informs the sorting equipment to process the DUTs as disqualified products.

By the co-test-processors, the master-test-processor only needs to wait for the completion of the concurrent testing of all the co-test-processors to concurrently test concurrent signals of a plurality of sites (DUTs). Traditional single-core test processors need to be connected in series to test all the sites at this step.

Figure 5:
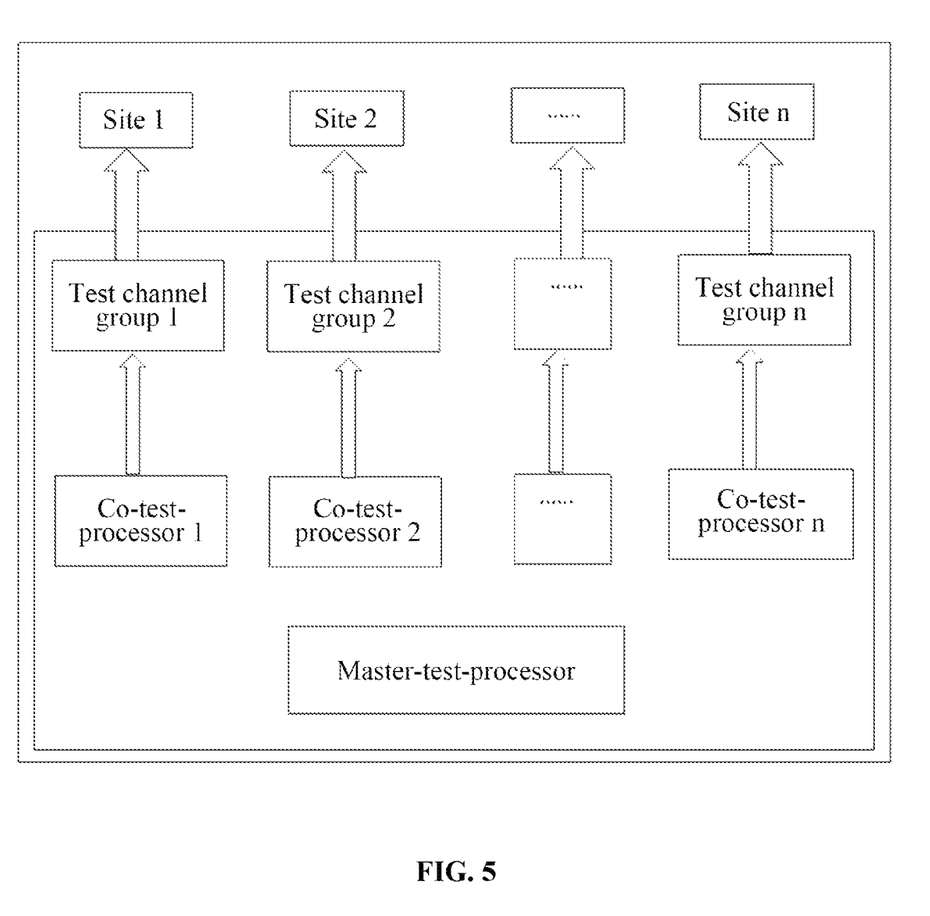
FIG. 5 is a schematic diagram of concurrent match test of multiple sites performed by an MCTP-based test device.
Figure 6:
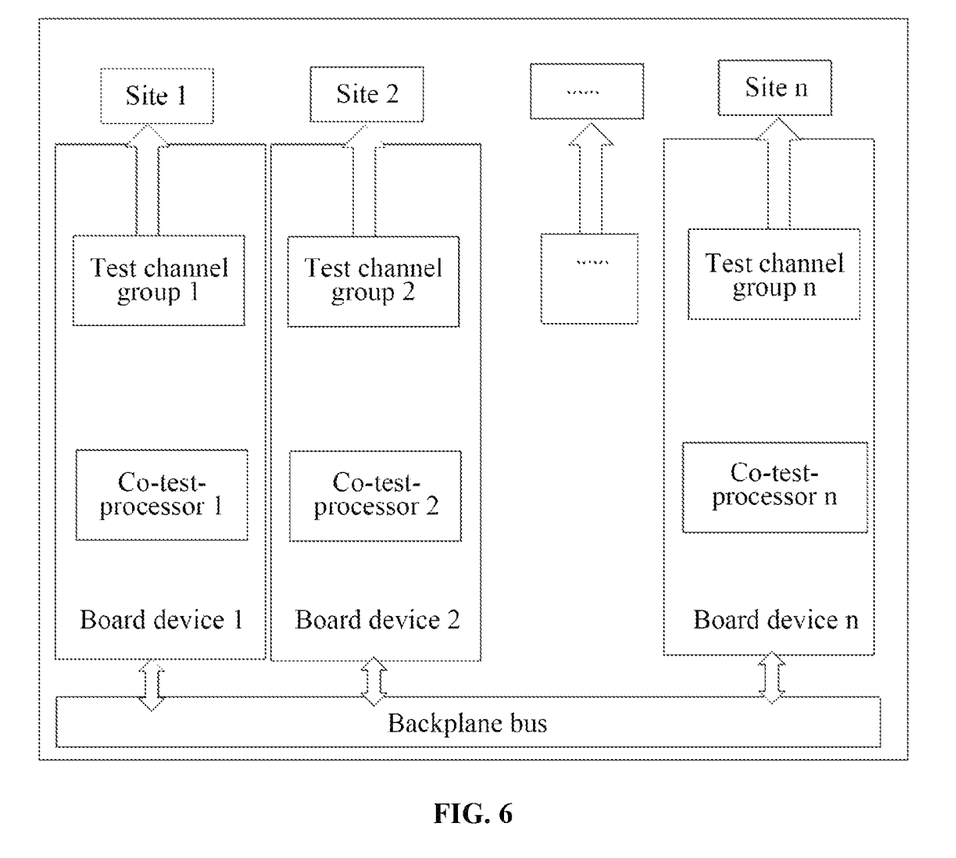
FIG. 6 is a schematic diagram of concurrent match of multiple sites performed by a test device with a plurality of single-core test processors.

As shown in FIG. 5 and FIG. 6, by an MCTP-based test device, only one board device and one MTP are required to complete the concurrent testing of the plurality of sites. This can not only meet the asynchronous match test requirement for multiple sites, but also utilize all test channel resources to a greater extent. The maximum test efficiency is achieved while the test cost of a single site within unit test time is reduced. The present disclosure can achieve asynchronous concurrent test on multiple sites and improve the test efficiency. Meanwhile, idling of fewer test channels can be avoided when asynchronous test channels are allocated to each site, thereby improving test channel utilization rate.

The above describes only the preferred embodiments of the present disclosure. It should be noted that those of ordinary skill in the art can further make several improvements and retouches without departing from the principles of the present disclosure. These improvements and retouches shall all fall within the protection scope of the present disclosure.

What is claimed is:

1. A digital signal test board device, comprising a bus controller (21), a multi-core test processor (23), a test subsystem controller, a test subsystem control bus (24), and a digital test subsystem, wherein the bus controller (21) is configured to achieve communication control between the digital signal test board device and a Personal Computer (PC) terminal;

the multi-core test processor (23) is configured to execute a test pattern file and generate a control command for a test subsystem; the multi-core test processor (23) comprises a co-test-processor-sync-controller (11), a master-test-processor (12), two or more co-test-processors (13), and a test subsystem command switching device (17); the master-test-processor (12) is connected to the co-test-processors (13) through a command bus I (14); the master-test-processor (12) is connected to the test subsystem command switching device (17) through a command bus II (15); the co-test-processors (13) are connected to the test subsystem command switching device (17) through a command bus III (16);

the master-test-processor (12) is a global test processor; the master-test-processor (12) works synchronously or asynchronously with other global processors, executes master test pattern files in parallel or concurrently, then sends a master test command to each subordinate test subsystem, and at the same time, delivers local test patterns that require concurrent testing to the co-test-processors (13) for execution;

the co-test-processor-sync-controller (11) is configured to control whether all the co-test-processors (13) work synchronously or asynchronously;

the co-test-processors (13) are local test processors, and the co-test-processors (13) are controlled by the master-test-processor (12) to execute the local test pattern files, and then send a local test command to the subordinate test subsystems of the co-test-processors;

the test subsystem command switching device (17) is configured to switch the master test commands sent by the master-test-processor (12) to the subordinate test subsystems of the master-test-processor and switch the local test commands sent by the co-test-processors (13) to the subordinate test subsystems of the co-test-processors;

the test subsystem control bus (24) is configured to transfer a control command between the multi-core test processor (23) and the test subsystem;

the test subsystem controller is configured to receive the control command generated by the multi-core test processor (23) for the test subsystem, and generate a test subsystem channel control command according to the control command;

the test subsystem (25) receives the test subsystem channel control command generated by the test subsystem controller, and outputs any digital test timing signal according to a requirement of the test pattern file, or performs match analysis on any signal under test.

2. The digital signal test board device according to claim 1, wherein the master-test-processor and the co-test-processors are built according to a Von Neumann architecture test processor (4); the on Neumann architecture test processor (4) comprises a timing generator (1), a test pattern generator (2), a signal processing unit control command generator (3), a memory control (5), and a pattern memory (6);

the pattern memory (6) is configured to store a compiled test pattern file code;

the timing generator (1), the test pattern generator (2), and the signal processing unit control command generator (3) access the pattern memory through the memory control (5) to acquire commands and data;

the timing generator (1) is configured to generate an accurate timing signal required by each cycle according to a timing requirement specified by the pattern file in the compiled test pattern file code;

the test pattern generator (2) is configured to generate, according to the command requirement of the pattern file in the compiled test pattern file code and the accurate timing signal generated by the timing generator (1), a control timing required by the pattern test, and control the memory control (5) to access an address of the pattern memory;

the signal processing unit control command generator (3) is controlled by the control timing generated by the test pattern generator (2) to send the test subsystem control command to the corresponding subsystems to achieve synchronous control of the subsystems.

3. He digital signal test board device according to claim 2, wherein each co-test-processor (13) and the master-test-processor (12) asynchronously work in different clock domains, and the co-test-processor (13) and other co-test-processors work in the same or different clock domains.

4. The digital signal test board device according to claim 3, wherein all the co-test-processors (13) are controlled by the co-test-processor-sync-controller (11) to work in the same or different clock domains independently or group by group.

5. The digital signal test board device according to claim 4, wherein the test subsystem is composed of a digital level driver, a window comparator, a dynamic load generator and a precision current source.

6. An automatic test system, comprising a master control Personal Computer (PC) (31), and one or more digital signal test board devices (35) according to claim 1, wherein the master control PC (31) is configured to run a test program to generate a board working signal, and transmit the board working signal to the corresponding digital signal test board devices (35) to control the digital signal test board devices (35) to work;

each digital signal test board device (35) is configured to execute a test pattern file according to the board working signal, generate a test excitation signal to a DUT, analyze a response of the DUT to form a test result, and transmit the test result to the master control PC (31).

7. The automatic test system according to claim 6, comprising a Peripheral Component Interface Express (PCIE) bus controller (32), wherein the PCIE bus controller (32) is configured to achieve data communication between the master control PC (31) and the digital signal test board devices (35).

8. The automatic test system according to claim 7, comprising a high-speed backplane bus (34), wherein the high-speed backplane bus (34) is configured to achieve data transmission between the PCIE bus controller (32) and the digital signal test board devices (35), and signal synchronization between all the digital signal test board devices (35).

9. A test method of the automatic test system according to claim 8, comprising the following steps:

step 1, downloading, by the master control PC (31), pattern files corresponding to test processors in all the digital signal test board devices (35) into the pattern memories (6) of the corresponding test processors;

step 2, configuring, by the master control PC (31), all the used digital signal test board devices (35) to be in desired states according to a requirement of a DUT;

step 3, synchronously initiating, by the master control PC (31), all the master-test-processors of all the digital signal test board devices (35), executing master test pattern files for concurrent testing, and analyzing a response of the DUT to form a test result I;

step 4, executing, by all the master-test-processors, local test pattern files that require asynchronous match or concurrent testing, and initiating the corresponding co-test-processors (13);

step 5, executing, by all the co-test-processors (13), concurrent testing on the local test pattern files to perform concurrent signal match on a plurality of DUTs, analyzing responses of the DUTs to form test results II, and transmitting the test results II to the master control PC (31);

step 6, determining whether the corresponding co-test-processors (13) complete the execution in a waiting period of all the master-test-processors; if the execution ends, transmitting the test result I to the master control PC (31);

step 7, acquiring, by the master control PC (31), the test result I and the test results II; comprehensively analyzing whether the test on the DUTs succeeds; if the test succeeds, informing sorting equipment to process the DUTs as qualified products; and if the test fails, informing the sorting equipment to process the DUTs as disqualified products.

* * * * *